US012791614B2

(12) United States Patent
Chaudhary et al.

(10) Patent No.: US 12,791,614 B2
(45) Date of Patent: Nov. 10, 2026

(54) MERGED PARAMETRIC SCAN TOPOLOGY

(71) Applicant: Texas Instruments Incorporated, Dallas, TX (US)

(72) Inventors: Abhishek Chaudhary, Nagpur (IN); Grant Ford, Flower Mound, TX (US); Rubin A. Parekhji, Bangalore (IN); Edward C. Suder, Garland, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 96 days.

(21) Appl. No.: 18/828,799

(22) Filed: Sep. 9, 2024

(65) Prior Publication Data

US 2025/0085346 A1 Mar. 13, 2025

Related U.S. Application Data

(60) Provisional application No. 63/581,313, filed on Sep. 8, 2023.

(51) Int. Cl.
*G01R 31/3185* (2006.01)

(52) U.S. Cl.
CPC ................ *G01R 31/318572* (2013.01); *G01R 31/318541* (2013.01)

(58) Field of Classification Search
CPC .... G01R 31/318572; G01R 31/318541; G01R 31/31855; G01R 31/318558
See application file for complete search history.

(56) References Cited

U.S. PATENT DOCUMENTS

| | | | | |
|---|---|---|---|---|
| 7,328,387 B2 * | 2/2008 | Whetsel | G01R 31/318541 | 324/762.02 |
| 8,438,439 B2 * | 5/2013 | Xie | G01R 31/318533 | 714/724 |
| 2011/0271159 A1 * | 11/2011 | Ahn | G06F 11/2733 | 714/724 |

OTHER PUBLICATIONS

"IEEE Standard for Test Access Port and Boundary-Scan Architecture," in IEEE Std 1149.1-2013 (Revision of IEEE Std 1149.1-2001) , vol., no., pp. 1-444, May 13, 2013 (Year: 2013).*
L. Whetsel, "An IEEE 1149.1 based test access architecture for ICs with embedded cores," Proceedings International Test Conference 1997, Washington, DC, USA, 1997, pp. 69-78 (Year: 1997).*
D. Bhattacharya, "Hierarchical test access architecture for embedded cores in an integrated circuit," Proceedings. 16th IEEE VLSI Test Symposium (Cat. No.98TB100231), Monterey, CA, USA, 1998, pp. 8-14 (Year: 1998).*

(Continued)

*Primary Examiner* — Cynthia Britt
(74) *Attorney, Agent, or Firm* — Michael T. Gabrik; Charles F. Koch

(57) ABSTRACT

Methods and apparatus for boundary scan. In one example, a circuit includes at least one first input/output (I/O) device, at least one boundary scan element coupled to the at least one first I/O device, and at least one second I/O device coupled to the at least one boundary scan element. The circuit may further include a test controller coupled to the at least one boundary scan element and configured to control the at least one boundary scan element to drive the at least one first I/O device and the at least one second I/O device with a binary test signal.

19 Claims, 10 Drawing Sheets

(56) References Cited

OTHER PUBLICATIONS

"DS36C200,DS90C031,DS90C031B,DS90C032, DS90C032B,DS90C402,DS90LT012A, DS90LT012AQ, DS90LV011A, DS90LV011AQ, DS90LV012A,DS90LV017A,DS90LV018A, DS90LV019,DS90LV027,DS90LV027A, DS90LV027AQ,DS90LV028A,DS90LV028AQ, DS90LV031A,DS90LV032A,DS90LV047A, DS90LV048A,DS90LV049, DS90LV049Q," An Overview of LVDS Technology, Texas Instruments, National Semiconductor Corporation. (1998). 8 pages.

* cited by examiner

MERGED PARAMETRIC SCAN TOPOLOGY

CROSS-REFERENCE TO RELATED APPLICATIONS

This application claims the benefit of and priority to U.S. Provisional Patent Application No. 63/581,313 filed on Sep. 8, 2023, which is hereby incorporated herein by reference in its entirety.

TECHNICAL FIELD

This description relates to integrated circuit testing systems and methods, and, more particularly, to performing parametric tests using boundary scan elements.

BACKGROUND

Boundary scan is a method for testing interconnects on a printed circuit board or in an integrated circuit at the inputs and outputs of the circuit, in a stand-alone configuration, in a loop-back mode, or on an interposer with multiple integrated circuits placed thereon. Boundary scan testing involves the use of test cells (also referred to as boundary scan elements) that are internally connected to the input/output pins of an integrated circuit. These boundary scan elements are connected in a dedicated path internal to the integrated circuit and typically positioned around the boundary of the integrated circuit. This path provides a virtual access capability that circumvents (or overrides) the normal circuit inputs and/or outputs to provide direct control of the device for testing interconnects. The path provides controllability using boundary scan elements at the device outputs to provide stimuli to the interconnects outside the device. It also provides visibility at the device inputs to observe the response on the interconnects to the test stimuli that are driven through the boundary scan elements. Boundary scan thus provides a mechanism by which to gain test access to an integrated circuit board without requiring physical test probes external to the device.

SUMMARY

According to one example, a circuit comprises at least one first input/output (I/O) device, at least one boundary scan element coupled to the at least one first I/O device, at least one second I/O device, and test circuitry configured to selectively couple the at least one second I/O device to the at least one boundary scan element, the test circuitry including a test controller coupled to the at least one boundary scan element and configured to control the at least one boundary scan element to drive the at least one first I/O device and the at least one second I/O device with a binary test signal.

According to another example, a circuit (e.g., an integrated circuit or other device) comprises a circuit board, a plurality of first input/output (I/O) devices disposed on the circuit board, a corresponding plurality of boundary scan elements disposed on the circuit board, individual boundary scan elements of the plurality of boundary scan elements coupled to respective individual first I/O devices of the plurality of first I/O devices, and a plurality of second I/O devices disposed on the circuit board and coupled to one or more of the plurality of boundary scan elements.

According to another example, a method comprises performing a first boundary scan test by (i) driving a plurality of first input/output (I/O) devices using a plurality of boundary scan elements, and (ii) observing first state signals from the plurality of first I/O devices. The method further comprises controlling a plurality of switches to couple the plurality of boundary scan elements to a plurality of second I/O devices, and performing a second boundary scan test by (i) driving the plurality of second I/O devices using the plurality of boundary scan elements, and (ii) observing second state signals from the plurality of second I/O devices.

DETAILED DESCRIPTION

Figure 1A:
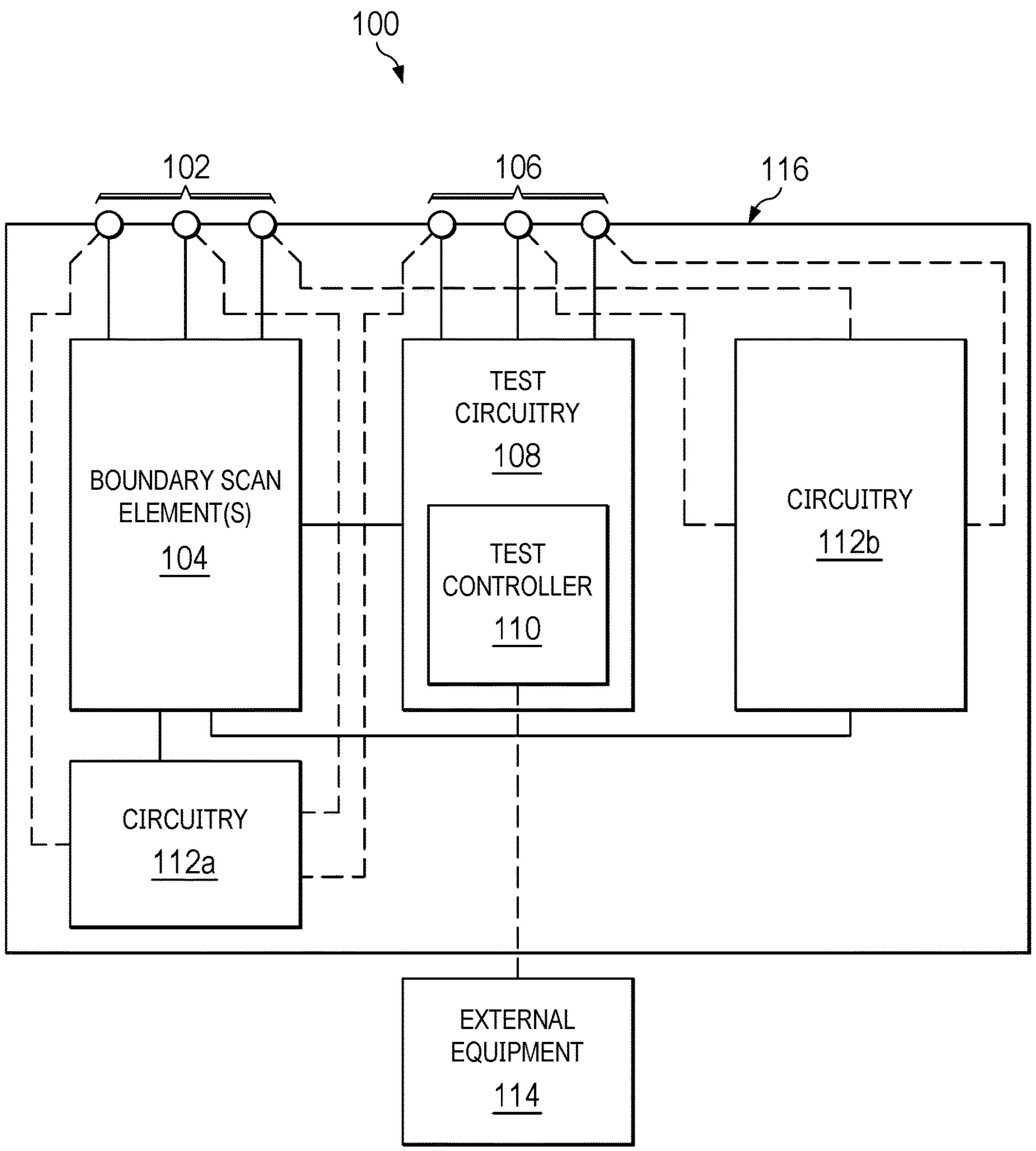
FIG. 1A is a block diagram of an integrated circuit including test circuitry for DC parametric testing, according to certain examples.

Techniques are described for implementing direct current (DC) parametric testing of an integrated circuit using boundary scan elements that are shared among sets of input/output (I/O) pins. In particular, examples provide techniques for using boundary scan elements provided in a circuit for one set of I/O pins to test interconnects among one or more other sets of I/O pins that do not have dedicated boundary scan elements. By sharing boundary scan elements according to examples described herein, test access can be provided for I/O pins that otherwise may not be available for testing and/or circuit footprint can be reduced by reducing the number of boundary scan elements needed to provide full testing capability. In one such example, a circuit comprises at least one first input/output (I/O) device, at least one boundary scan element coupled to the at least one first I/O device, and at least one second I/O device coupled to the at least one boundary scan element via test circuitry. The test circuitry may comprise a test controller coupled to the at least one boundary scan element and configured to control the at least one boundary scan element to drive the at least one first I/O device and the at least one second I/O device with a binary test signal.

General Overview

As described above, boundary scan testing provides a mechanism by which to gain test access to an integrated circuit without the need for external physical probes. As circuits become more complex, physically testing all the circuit interconnects can be time-consuming and potentially difficult. Using boundary scan, the need for such physical test access can be eliminated, or at least reduced. In addition, boundary scanning provides the ability to test interconnects between circuits with arbitrary functionality, thereby eliminating or reducing the need to design circuit-specific test routines a multitude of various devices.

Devices communicate with external circuitry through their I/O pins. Devices configured to support boundary scan include boundary scan elements (or test cells) coupled to the I/O pins of the device and configured to selectively override the functionality of the respective I/O pins. As described further below, the boundary scan elements can include shift register cells that can be used to force test data through the circuit outputs of a first integrated circuit according to certain test conditions. Test results can be observed by reading the resulting signals present at the input pins of a second integrated circuit (connected via its input pins to the output pins the first integrated circuit). In some examples, to support boundary scan testing, a device includes a dedicated internal boundary scan element for each I/O pin. However, providing dedicated boundary scan elements for each individual I/O pin of a device can consume significant area on an internal circuit board of the device or inside an integrated circuit. Further, while standards requiring dedicated boundary scan elements exist for certain technologies and/or types of integrated circuits, such standards may not be applicable to other technologies and/or types of integrated circuits. As a result, circuits can be designed and produced in which not every I/O pin has a dedicated boundary scan element. For I/O pins that do not have dedicated boundary scan elements, DC parametric testing may be performed separately from the boundary scan used to test those I/O pins that do have dedicated boundary scan elements. This approach may add significant time to testing routines, and can add significant complexity. Furthermore, in some instances physical testing (e.g., using physical probes) of I/O devices lacking boundary scan elements may not be viable, and setting up functional tests for such I/O devices can be difficult.

Accordingly, techniques are disclosed herein for allowing boundary scan elements to be shared among sets of I/O pins, such that I/O pins that do not have dedicated boundary scan elements can nonetheless be tested using boundary scan test routines. In some examples, a control mechanism is provided to drive multiple sets of I/O devices with a single set of shared boundary scan elements. Furthermore, techniques are described by which boundary scan tests for I/O pins without dedicated boundary scan elements can be merged with tests for I/O pins with boundary scan elements as part of a single test routine or test sequence. In some examples, for I/O devices that do not have boundary scan elements associated therewith, control and observation mechanisms are provided using internal flip-flops (or other latch elements) and/or switches that directly connect I/O devices without boundary scan elements to I/O devices that do have boundary scan elements.

According to certain examples, a method of testing a circuit comprises performing a first boundary scan test by (i) driving a plurality of first I/O devices using a plurality of boundary scan elements, and (ii) observing first state signals from the plurality of first I/O devices. In some examples, two types of potential faults can be observed using boundary scanning, namely faults (e.g., open circuit or short circuit conditions) on individual input or output signal paths or faults across two adjacent input or output signal paths. Accordingly, the first I/O devices can be driven, via the boundary scan elements, with a binary test signal configured such that adjacent I/O devices have alternating binary values (e.g., logical 1s or 0s) applied. The use of a binary test signal with alternating binary values allows testing for faults across two adjacent signal paths. If no faults are present, a corresponding alternating binary pattern should be observed across the first state signals, as described further below. The method may further comprise controlling a plurality of switches to couple the plurality of boundary scan elements to a plurality of second I/O devices, and performing a second boundary scan test by (i) driving the plurality of second I/O devices using the plurality of boundary scan elements, and (ii) observing second state signals from the plurality of second I/O devices. Thus, the same boundary scan elements used to test the first I/O devices can be used to test the second I/O devices, thereby obviating the need for dedicated boundary scan elements to be provided for the second I/O devices. In some examples, the second I/O devices can be driven with a binary test signal, as described above for the first I/O devices.

In some examples, a circuit comprises a plurality of first I/O devices, a corresponding plurality of boundary scan elements, and a plurality of second I/O devices. In some examples, circuit is an integrated circuit, and the plurality of first I/O devices, the plurality of boundary scan elements, and the plurality of second I/O devices are disposed on a circuit board (or other substrate) that is part of and internal to the integrated circuit. For example, the circuit board may be an integrated circuit layout that includes a plurality of embedded circuit elements. The plurality of boundary scan elements are individually coupled to respective individual ones of the plurality of first I/O devices. Further, the plurality of second I/O devices can be selectively coupled to one or more of the plurality of boundary scan elements. Accordingly, the boundary scan elements can be used to perform boundary scan testing of the second I/O devices as well as of the first I/O devices. In some examples, the circuit includes a test controller coupled to the plurality of boundary scan elements and configured to drive the first I/O devices and the second I/O devices with a binary test signal. The test signal can be configured for DC parametric testing of the circuit.

These and other features are described in more detail below.

Example System Architecture

FIG. 1A is a block diagram illustrating a circuit 100 (e.g., an integrated circuit) configured for merged boundary scan testing according to certain examples. In this example, the circuit 100 includes a plurality of first input/output (I/O) devices (e.g., pins, optionally including associated circuitry such as a buffer element, for example) 102 and a plurality of boundary scan elements 104 coupled to the plurality of first I/O devices 102. In some examples, each first I/O device 102 is coupled to a corresponding dedicated boundary scan element 104. The circuit 100 may further comprise a plurality of second I/O devices (e.g., pins) 106. In some examples, these second I/O devices do not have dedicated boundary scan elements. In some examples the first I/O devices 102 are complementary metal oxide semiconductor (CMOS) I/O devices. In some examples, at least some of the second I/O devices 106 are low voltage differential signaling (LVDS) I/O devices. The plurality of first I/O devices 102 and the plurality of second I/O devices 106 may each include any number of I/O devices (e.g., tens or hundreds of I/O devices), and the number of first I/O devices 102 may be the same as, less than, or greater than, the number of second I/O devices 106.

The circuit 100 further includes test circuitry 108 coupled to the plurality of boundary scan elements 104 and configured to allow some or all of the boundary scan elements 104 to be shared by the second I/O devices 106, as described further below. The test circuitry 108 may include a test controller 110 configured to drive the boundary scan elements with test signals to perform DC parametric testing of the first I/O devices 102 and the second I/O devices 106, as also described further below. The test circuitry 108 may further include circuitry, such as circuit traces, switches, and/or other components, that allow the second I/O devices to share the boundary scan elements 104 associated with the first I/O devices 102, as described further below.

Still referring to FIG. 1A, the circuit 100 includes circuitry 112 that performs various functionality according to normal operation of the circuit 100. The circuitry 112 is coupled to the first and second I/O devices 102, 106 to allow the circuit 100 to receive inputs from, and provide outputs to, other external circuitry, devices, or systems. The circuitry 112 is also coupled to the boundary scan elements 104. In the example illustrated in FIG. 1A, the circuitry 112 includes first circuitry 112*a* and second circuitry 112*b*; however, the circuitry 112 may include any number of components, modules, sub-systems, circuit traces, etc., depending on the design, purpose and/or function of the circuit 100. In some examples, the first and second I/O devices 102, 106, the boundary scan elements 104, the test circuitry 108, and the circuitry 112 are disposed on one or more circuit boards 116 (or other substrate(s) on which circuit components and traces can be implemented).

Figure 1B:
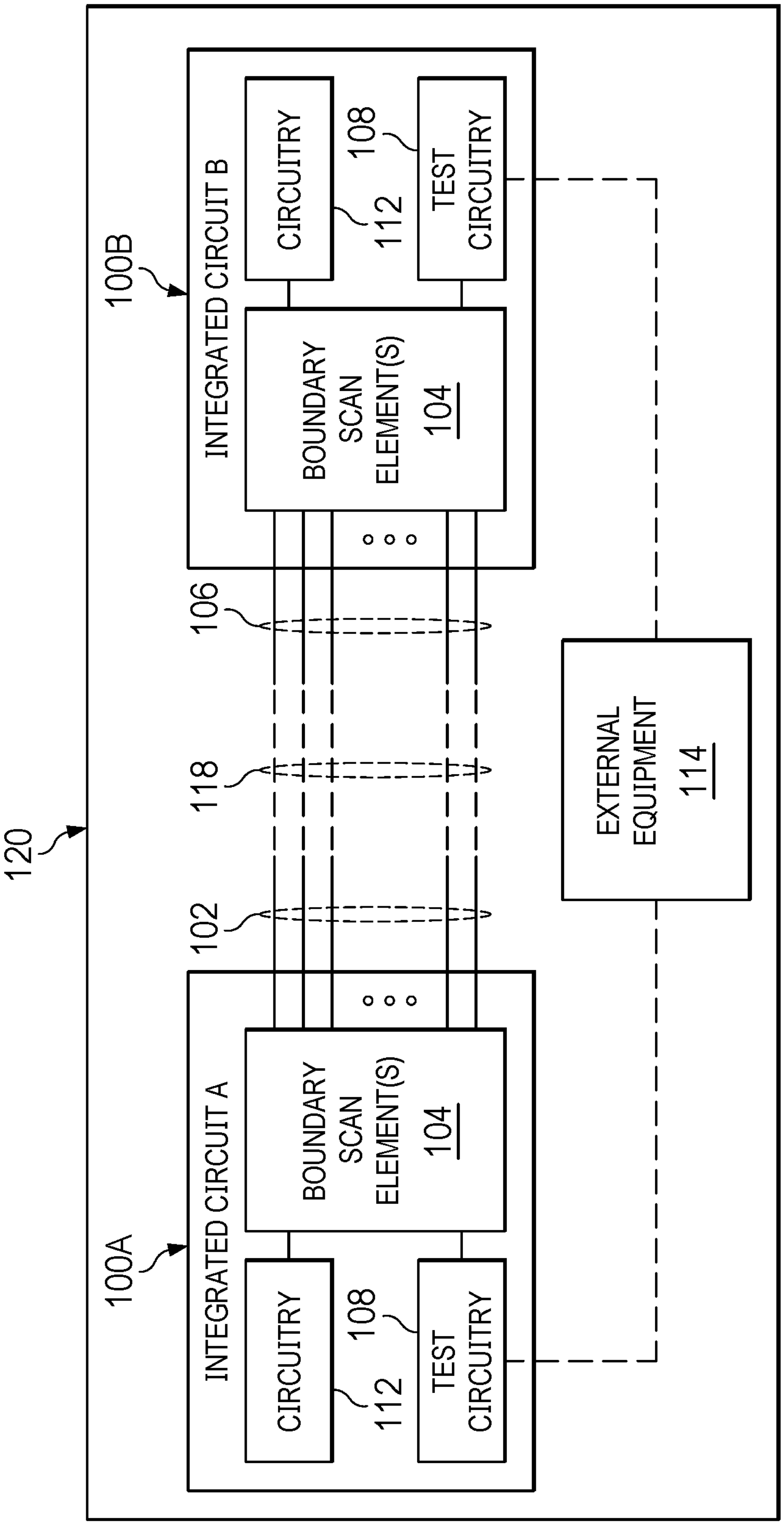
FIG. 1B is a block diagram illustrating a boundary scan testing scenario using two examples of the integrated circuit of FIG. 1A, according to certain examples.

FIG. 1B illustrates an example of a system 120 in which merged boundary scanning can be used to test interconnects between first and second circuits (e.g., integrated circuits) 100A, 100B in accord with techniques described herein. The circuits 100A and 100B are examples of the circuit 100 illustrated in FIG. 1A. The circuits 100A and 100B may have the same or different functionality. That is, the circuitry 112 of the first circuit 100A may be the same or different than the circuitry 112 of the second circuit 100B. It will be appreciated that, for simplicity, not all components, circuitry and/or interconnections of the circuits 100A, 100B is shown in FIG. 1B. According to certain examples, a single test sequence can be implemented for some or all I/O devices of the circuits 100A, 100B in which the I/O devices 102 and 106 of the first circuit 100A are stimulated by test signals applied via the boundary scan elements 104 of the first circuit 100A, and responses are measured via the boundary scan elements 104 of the second circuit 100B under control of the test controller 110 (or other circuitry) of the second circuit 100B. For example, signals 118 present at output I/O devices 102 and/or 106 of the first circuit 100A (driven by a test sequence applied via the boundary scan elements 104 of the first circuit 100A) can be observed at corresponding connected input I/O devices 102 and/or 106 of the second circuit 100B, via the boundary scan elements 104 of the second circuit 100B. Techniques described herein thus allow for simplified, streamlined DC parametric testing for circuits that may include a large number of mixed CMOS and LVDS I/O devices, some of which lack dedicated boundary scan elements.

Continuing with the examples of FIGS. 1A and 1B, boundary scanning can be used to perform a variety of DC parametric tests of the circuit 100. For example, boundary scan testing can be used to test voltage and/or current at individual ones of the first I/O devices 102 and/or the second I/O devices 106. Boundary scan testing can also be used to test interconnects between pairs of the first I/O devices 102 and/or second I/O devices 106 of the first and second circuits 100A, 100B (e.g., the interconnection between an I/O device 102/106 of the first circuit 100A and an I/O device 102/106 of the second circuit 100B). As described above, individual boundary scan elements 104 can comprise a test cell, such as a latch cell, that when connected to an I/O device (e.g., one or more of the first I/O devices 102 or the second I/O devices 106) can selectively override the functionality of that I/O device. The boundary scan elements 104 can be programmed via the test controller 110 to drive a test signal onto an I/O device of the first circuit 100A and thus across an individual interconnect between the first and second circuits 100A, 100B. The I/O device of the second circuit 100B at the destination of the interconnect can then be read, verifying that the interconnect properly connects two I/O devices (and thus the two circuits 100A, 100B), or determining that a fault exists. For example, if the interconnect is shorted to another signal trace or device, or in an open circuit fault exists, the correct expected signal value will not be present at the destination I/O device, thus indicating a fault.

According to certain examples, the boundary scan elements 104 include latch cells that, for normal operation of the circuit 100, are set such that they have no effect on the circuit 100 (e.g., on the circuitry 112) and are therefore essentially invisible. The individual latch cells of the boundary scan elements 104 can be connected together to form one or more boundary scan shift registers. In some examples, when the circuit 100A is set into a test mode, the boundary scan elements 104 allow a test data stream from the test controller 110 to be shifted from one latch into the next. Once a complete data word has been shifted into the circuit 100A being tested, it can be latched into place such that it drives defined signals through the connected output I/O devices 102 and/or 106. These signals can be read on the input I/O devices 102 and/or 106 of the second circuit 100B being tested, or via another read-out mechanism as described further below, to monitor for faults in the interconnections between the circuits 100A, 100B.

The test controller 110 can be configured to control the boundary scan elements 104 to perform one or more DC parametric tests of pairs of circuits 100 by sending particular test signals to the boundary scan elements 104. In some examples, the test signals, and expected test results, are defined by a test standard, such as a standard from the Joint Test Action Group (JTAG). In some such examples, the test signals and expected test results can be specified in a Boundary Scan Description Language (BSDL) file that is loaded to the test controller 110. In some examples, the test controller 110 can receive the BSDL file and/or other test instructions from external test equipment 114. Results of the test routine(s)/sequence(s) can also be provided from the test controller 110 to the external test equipment, either during a test routine or at a later time.

As described above, in certain examples, the test circuitry 108 comprises logic and/or other circuitry configured to allow boundary scan testing of the second I/O devices 106 using dedicated boundary scan elements 104 provided for the first I/O devices 102. Accordingly, the test circuitry 108 can include switches, circuit traces, and/or other components configured to selectively couple individual ones of the boundary scan elements 104 to one or more of the second I/O devices 106. Examples are described further below with reference to FIGS. 2A-5. In addition, in some examples, the test circuitry 108 includes readout latches coupled to the second I/O devices 106 and configured to allow test results received via the second I/O devices 106 and the boundary scan elements 104 to be read out by the test controller 110 or other circuitry internal (e.g., the circuitry 112*a* or 112*b*) or external (e.g., the external test equipment 114) to the circuit 100. Examples are described further below with reference to FIGS. 4 and 5.

Figure 2A:
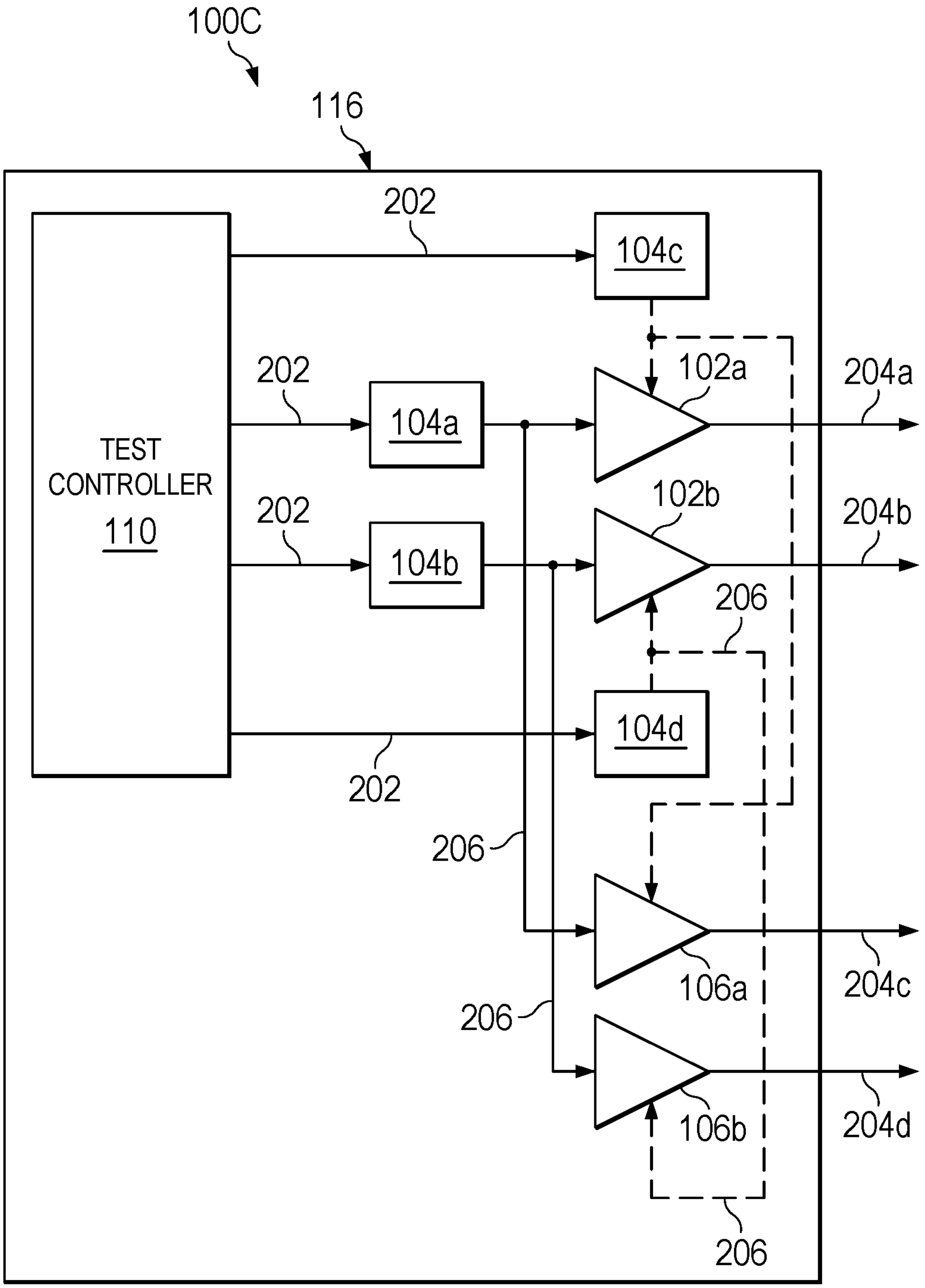
FIG. 2A is a schematic diagram of a portion of an integrated circuit including test circuitry, according to an example.

Turning to FIG. 2A, there is illustrated a circuit 100C that may represent a portion of the circuit 100 of FIG. 1A, for example. It will be appreciated that various circuitry and components of the circuit 100 shown in FIG. 1A (e.g., circuitry 112), for simplicity, are not illustrated in FIG. 2A. In the example of FIG. 2A, the circuit 100A includes a plurality of first I/O devices, individually identified as first I/O devices 102*a* and 102*b*. The circuit 100A includes first and second dedicated boundary scan elements 104*a*, 104*b* that are coupled to the first I/O devices 102*a*, 102*b*, respectively, to test I/O functionality of the first I/O devices 102*a* 102*b*. In the illustrated example, additional dedicated boundary scan elements 104*c*, 104*d* are individually associated with (and coupled to) the first I/O devices 102*a*, 102*b*, respectively. These additional dedicated boundary scan elements 104*c*, 104*d*, allow for testing of the enable functionality of the first I/O devices 102*a*, 102*b*, respectively.

Figure 4:
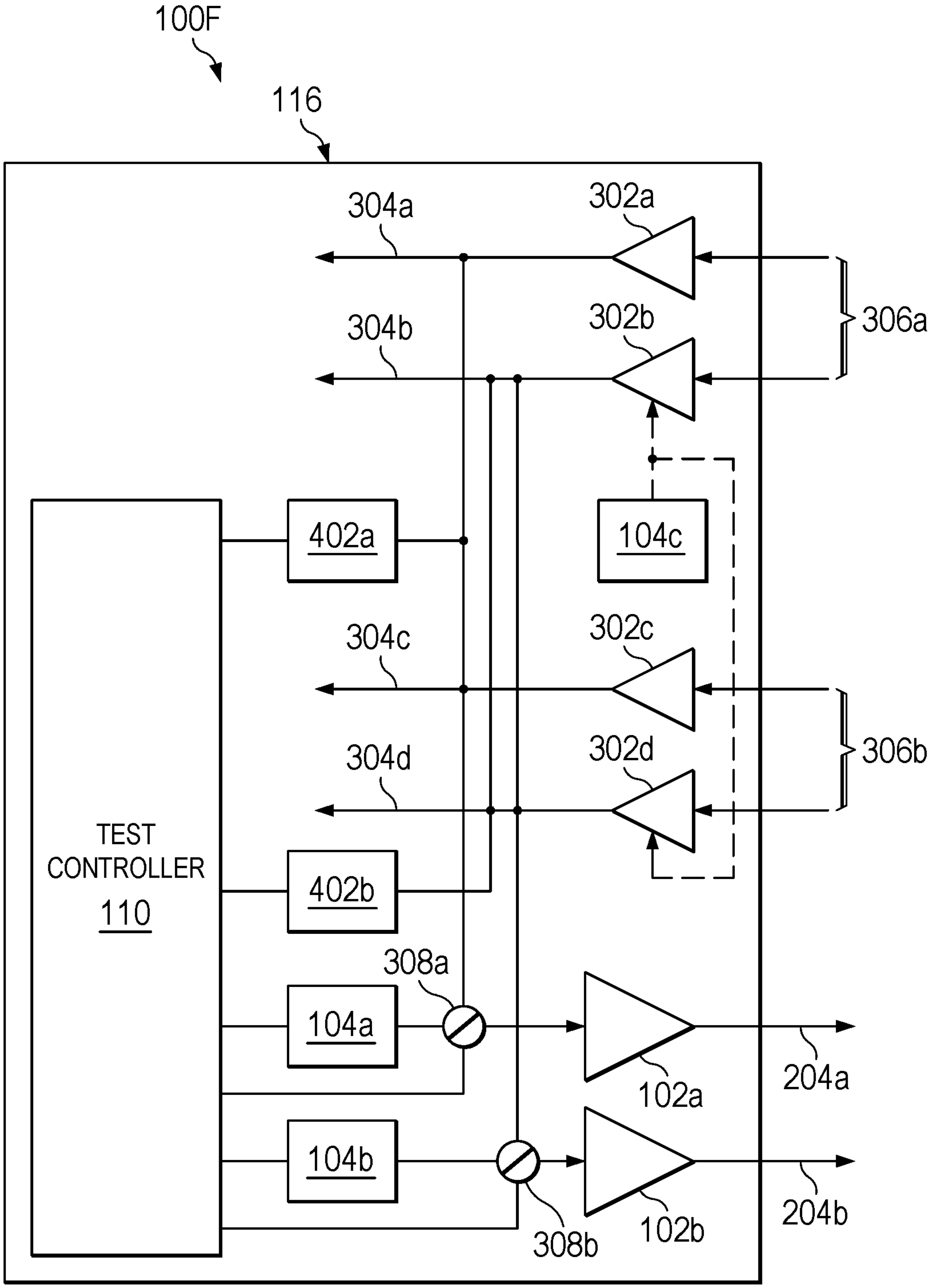
FIG. 4 is a schematic diagram of a portion of an integrated circuit including test circuitry, according to another example.
Figure 5:
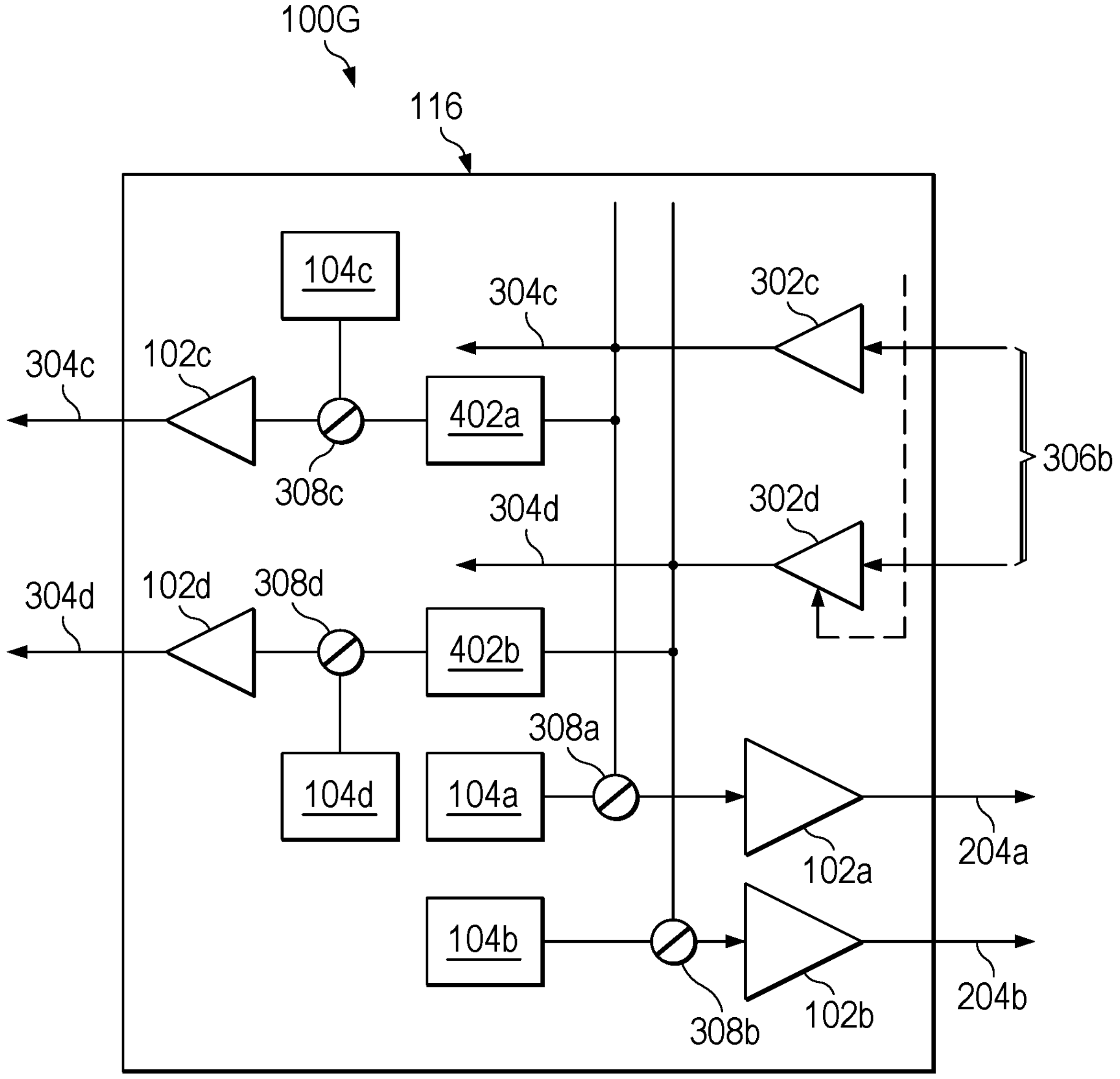
FIG. 5 is a schematic diagram of a portion of an integrated circuit including test circuitry, according to another example.

The circuit 100A further includes second I/O devices 106*a* and 106*b*. As illustrated, the second I/O devices 106*a*, 106*b* do not have dedicated boundary scan elements 104 associated therewith. As described above, this lack of boundary scan elements provided for the second I/O devices 106*a*, 106*b* could prevent certain testing of interconnections with the second I/O devices 106*a*, 106*b*, or present a need for more complex, time-consuming test routines. According to certain examples, however, the test circuitry 108 (FIG. 1A) provides mechanisms by which the dedicated boundary scan elements 104*a-d* provided for the first I/O devices 102*a*, 102*b*, can be shared with the second I/O devices 106*a*, 106*b*, thus allowing for boundary scan testing of the second I/O devices 106*a*, 106*b* using the boundary scan elements 104*a-d*. In the illustrated example of FIG. 2A, the I/O devices 102*a*, 102*b*, 106*a*, and 106*b* are shown as output (e.g., transmit) devices; however, the techniques and methodologies described herein can also be applied to I/O devices configured as input (e.g., receive) I/O devices (e.g., as illustrated in FIGS. 3-5).

It will be appreciated that although only two first I/O devices 102*a*, 102*b*, and two second I/O devices 106*a*, 106*b* are shown in FIG. 2A for simplicity, examples of the circuit 100A may include any number of first I/O devices 102 and any number of second I/O devices, as described above with reference to FIG. 1A. The test circuitry 108 can be configured to allow any second I/O devices 106 that do not have dedicated boundary scan elements 104 to share boundary scan elements associated with first I/O devices 102.

Still referring to FIG. 2A, in this example, circuit traces 206 are provided, connecting the boundary scan elements 104*a*, 104*c* to the second I/O device 106*a*, and connecting the boundary scan elements 104*b*, 104*d* to the second I/O device 106*b*. These circuit traces 206 may be part of the test circuitry 108, for example. According to certain examples, a boundary scan test sequence is implemented by loading a test signal (via one or more circuit traces 202) from the test controller 110 to the boundary scan elements, 104*a-d*. Output signals 204*a-d* from the I/O devices 102*a*, 102*b*, 106*a*, and 106*b* can be observed (e.g., using a second circuit 100) to determine whether or not a fault condition exists, as described above. In some examples, the test signal is a binary signal comprising an alternating sequences of logical 0s and logical 1s. The test signal can be applied such that opposite logical values (e.g., 0 or 1) are applied to adjacent I/O devices. This approach allows observation of whether adjacent channels (e.g., adjacent I/O devices and/or the circuit traces connected thereto) are shorted to one another.

In some examples, the test controller 110 provides the test signal via one or more direct digital interface (DDI) macros. For example, the test controller 110 may produce an 8-bit test signal that can drive four DDI macros to test 32 channels of I/O devices 102 and 106 in combination. With a configuration such as that shown in FIG. 2A, all transmit channels can be boundary scan enabled in parallel. For example, the test controller 110 applies the test signal to the boundary scan elements 104*a-d*, which are connected to both the first I/O devices 102*a*, 102*b* and to the second I/O devices 106*a*, 106*b*, such that the boundary scan elements 104*a-d* drive the first I/O devices 102*a*, 102*b* and the second I/O devices 106*a*, 106*b* in parallel. For example, as illustrated, the binary value loaded in the boundary scan element 104*a* is applied to both the first I/O device 102*a* and the second I/O device 106*a* in parallel. The same approach applies for the boundary scan elements 104*b-d*. In some examples, the test controller 110 applies the test signal to multiple boundary scan elements 104 directly, via individual circuit traces 202, as illustrated in FIG. 2A. In other examples, as described above, the boundary scan elements 104 are coupled together (as shown in FIG. 2B) and allow the test signal from the test controller 110 to be shifted from one boundary scan latch cell into the next.

For an even number of channels under test, an x-bit (e.g., 4-bit, 8-bit, etc.) test signal at circuit traces 202 can be repeated (e.g., concatenated), depending on the number of channels under test. For example, a test signal 1010 can be duplicated and concatenated to produce: 101010101010, etc. In this manner, adjacent channels (e.g., first I/O devices 102*a*, 102*b* may be positioned adjacent one another on the circuit board 116) can be driven with opposite binary values of the test signal at circuit traces 202, as described above. For an odd number of channels, however, concatenation of the binary test signal may result in some adjacent channels having the same binary value applied. For example, a test signal 101010101 (nine channels), duplication results in: 101010101101010101. Accordingly, to address this problem and allow parallel testing of higher numbers of channels, selective inversion can be applied in some boundary scan elements 104.

Figure 2B:
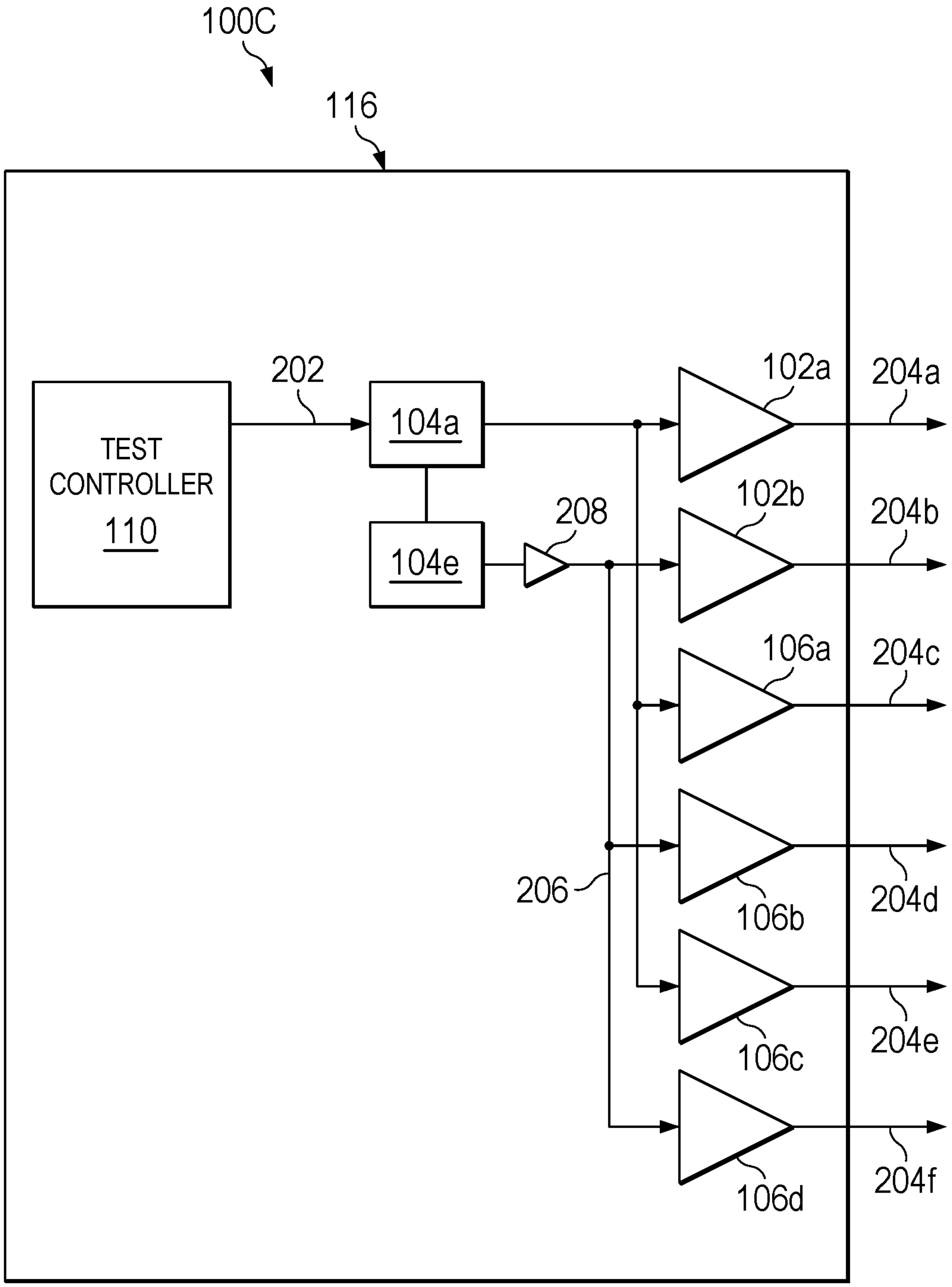
FIG. 2B is a schematic diagram illustrating a portion of a variation of the integrated circuit of FIG. 1A, according to an example.

For example, referring to FIG. 2B, a boundary scan element 104*e* include, or may be coupled to at its output, an inverter 208. The boundary scan element 104*e* is configured to drive alternating I/O devices 102*b*, 106*b*, 106*d*, with the boundary scan element 104*a* (without an inverter) is configured to drive the other alternating I/O devices 102*a*, 106*a*, 106*c*. As a result, adjacent I/O devices may be driven by opposite binary values. For example, considering the example above, the test signal 101010101 inverted becomes 010101010, such that the concatenated test signal is 101010101010101010. Thus, in some examples, an 18-bit test signal can drive two DDI macros to test 36 channels in parallel, with adjacent channels having opposite binary values. Numerous variations will be apparent, given the benefit of this disclosure, and are intended to be part of this disclosure. Furthermore, as described above, multiple boundary scan elements 104 can be connected together (e.g., boundary scan element 104*a* is shown connected to boundary scan element 104*e*) to form a boundary scan shift register. In such configurations, a test data stream comprising a sequence of binary valued bits (e.g., as described above) from the test controller 110 can be shifted from one boundary scan element (e.g., latch cell) into the next. Once a complete data word has been shifted into the collection of boundary scan elements 104, it can be latched into place such that it drives defined signals through the connected output I/O devices 102 and/or 106, as described above.

As noted above, in the examples shown in FIGS. 2A and 2B, the I/O devices are configured as output (transmit) devices, and the responses to the test signal can be observed at the outputs of the I/O devices. For input/receive I/O devices, alternating binary values can be applied (e.g., from external automated test equipment (ATE), such as the external test equipment 114 or another circuit 100, as described above) and loaded into the boundary scan elements 104 for read-out by the test controller 110, for example. As for the transmit configuration discussed with reference to FIGS. 2A and 2B, multiple input/receive channels can be driven in parallel, provided that adjacent channels receive opposite binary value signals. For example, adjacent input/receive channels can be connected to different ATE resources to ensure an alternating data stream, 1010 . . . , is applied.

Figure 3A:
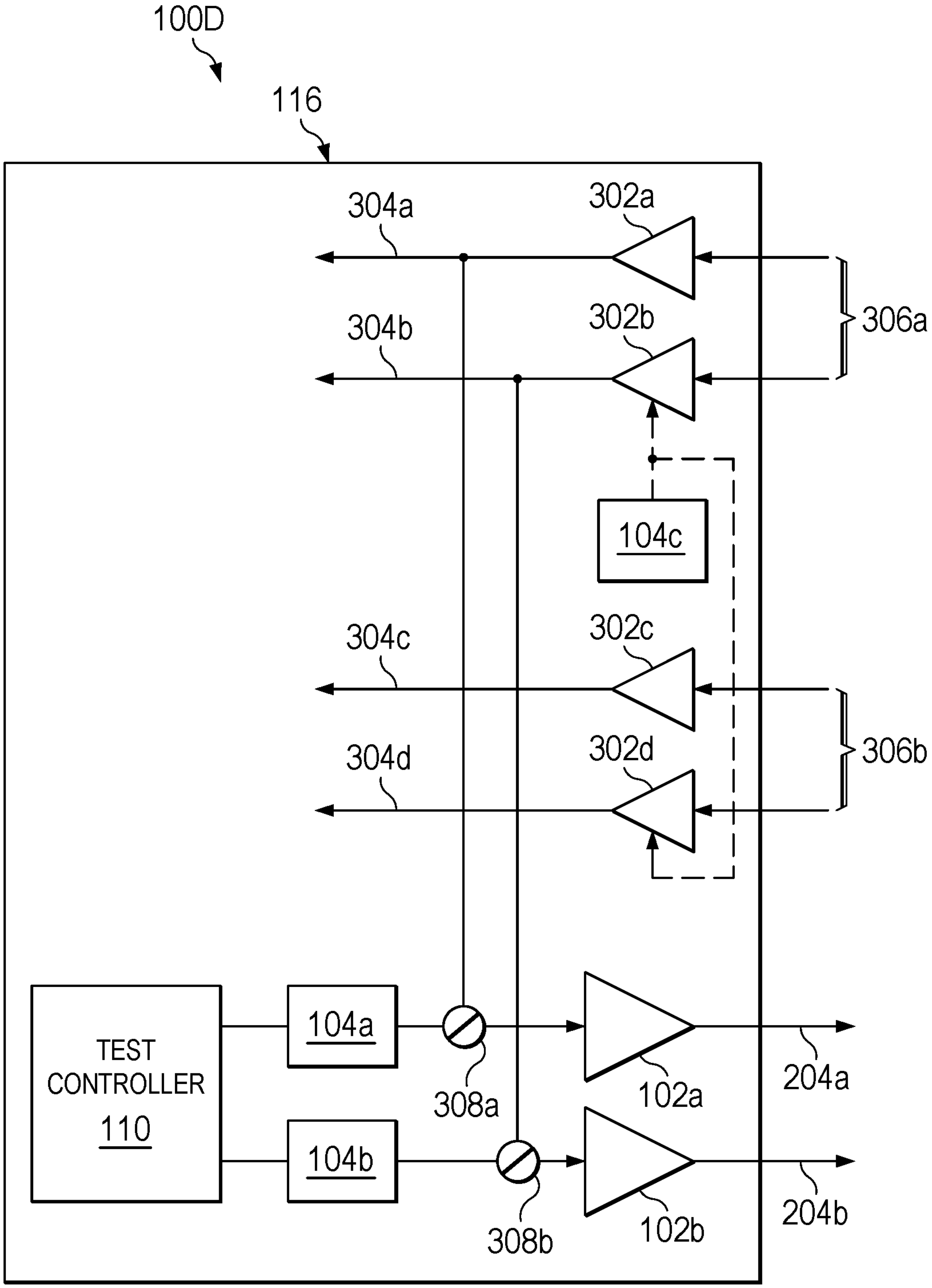
FIG. 3A is a schematic diagram of a portion of an integrated circuit including test circuitry, according to another example.
Figure 3B:
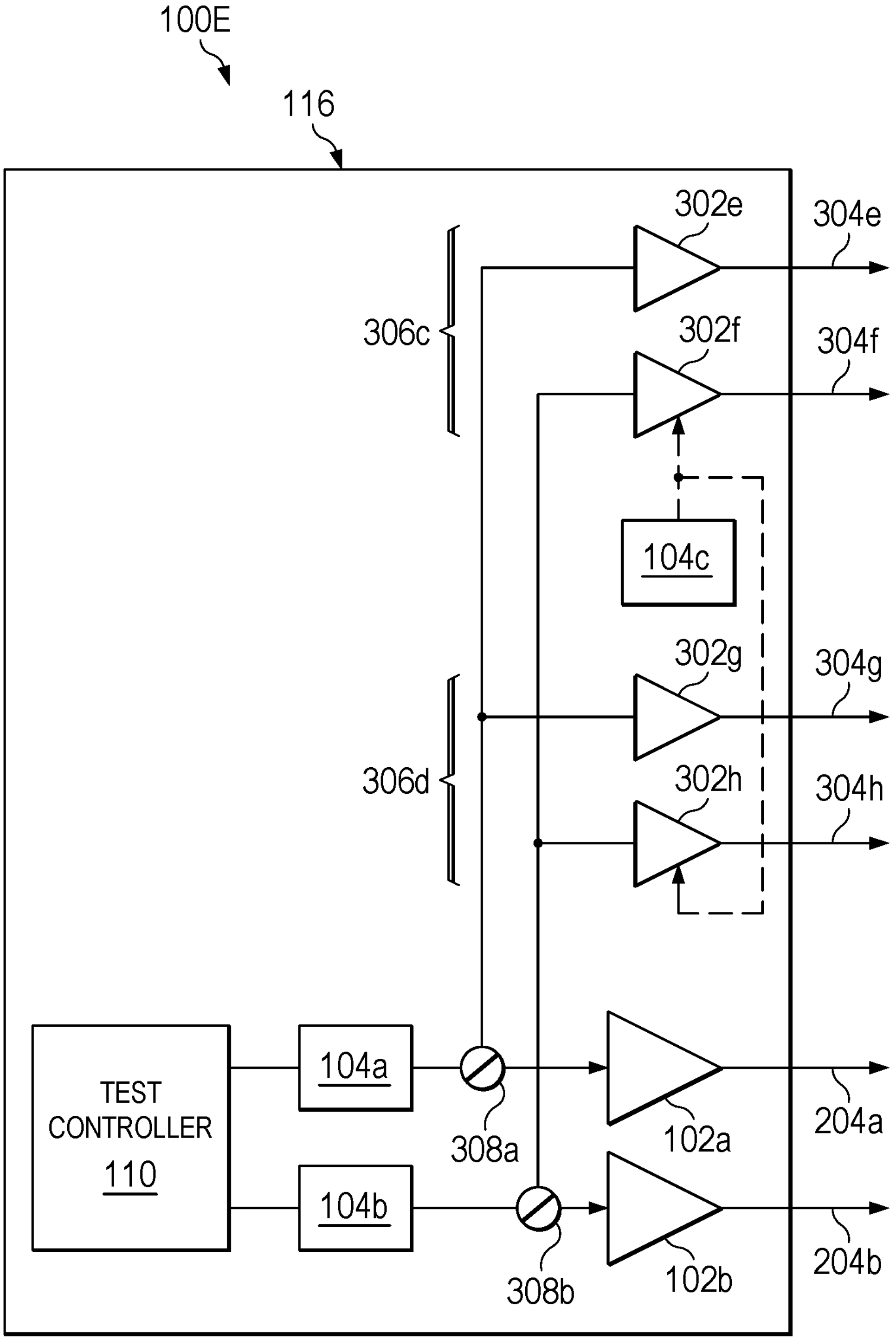
FIG. 3B is a schematic diagram of a portion of an integrated circuit including test circuitry, according to another example.

Referring to FIG. 3A, there is illustrated an example architecture for applying boundary scan to I/O devices that do not have boundary scan elements associated therewith. In the illustrated example, the circuit 100D (which may represent a portion of the circuit 100 of FIG. 1A) comprises a plurality of different signaling I/O devices (e.g., LVDS I/O devices), individually identified as differential I/O devices 302*a* and 302*b*. As with FIGS. 2A and 2B, in FIG. 3A certain circuitry of the circuit 100 (e.g., the circuitry 112), for simplicity, is not illustrated in FIG. 3A. Individual differential I/O devices 306*a*, 306*b* comprise a pair of I/O devices; for example, I/O devices 302*a* and 302*b* for differential I/O device 306*a* and I/O devices 302*c* and 302*d* for differential I/O device 306*b*. The differential I/O devices 306*a*, 306*b* are examples of the second I/O devices 106 of FIG. 1A. In the example illustrated in FIG. 3A, the differential I/O devices 306*a*, 306*b* are configured as input/receive channels. However, the techniques described herein can also be applied to differential I/O devices configured as output/transmit channels, as illustrated in FIG. 3B, for example. As illustrated, the differential I/O devices 306*a*, 306*b* do not have input/output boundary scan elements associated therewith.

The circuit 100D further includes first I/O devices 102*a*, 102*b* that are coupled to boundary scan elements 104*a*, 104*b*, as described above. In the illustrated example, the first I/O devices 102*a*, 102*b* are configured as output/transmit I/O devices. Boundary scan testing of the first I/O devices 102*a*, 102*b* may be accomplished using the boundary scan elements 104*a*, 104*b*, as described above. The outputs of the differential I/O devices 306*a*, 306*b* are coupled to switches 308*a*, 308*b* (collectively switches 308) that are also coupled to the inputs of first I/O devices 102*a*, 102*b*, and to the boundary scan elements 104*a*, 104*b*, as shown in FIG. 3A. The switches 308*a*, 308*b* may be part of the test circuitry 108 of FIGS. 1A and 1B, for example.

According to certain examples, when the circuit 100D is in a test mode, test data (e.g., supplied by the external test equipment 114) can be applied to the inputs of the differential I/O devices 306*a*, 306*b* (e.g., from another circuit 100). As described above, the test signals can include alternating sequences of binary values (e.g., 1010 . . . ) applied such that adjacent channels receive opposite binary values during any given test sequence. Responses of the differential I/O devices 306*a*, 306*b* to the test signals can be observed in a variety of ways.

For example, a first boundary scan sequence can be applied to test the first I/O devices 102*a*, 102*b* that have boundary scan elements 104*a*, 104*b*. As described above, the test signal can be applied from the test controller 110 to the boundary scan elements 104*a*, 104*b*, and the responses of the first I/O devices 102*a*, 102*b* can be observed in the output signals 204*a*, 204*b*, respectively. The switches 308*a*, 308*b* can then be operated (e.g., under control of the test controller 110) to connect the outputs of the differential I/O devices 306*a*, 306*b* to the boundary scan elements 104*a*, 104*b*. Responses of the differential I/O devices 306*a*, 306*b* to test signals applied to the inputs of the differential I/O devices 306*a*, 306*b* may then be read out via the boundary scan elements 104 under control of the test controller 110. Thus, in some examples, boundary scan testing of I/O devices with and without boundary scan elements can be performed in series.

Referring to FIG. 3B, there is illustrated an example of a circuit 100E in which differential I/O devices 306*c*, 306*d* are configured as output/transmit I/O devices. Accordingly, the individual differential I/O devices 306*c*, 306*d* comprise a pair of I/O devices; for example, I/O devices 302*e* and 302*f* for differential I/O device 306*c* and I/O devices 302*g* and 302*h* for differential I/O device 306*d*. The differential I/O devices 306*c*, 306*d* are examples of the second I/O devices 106 of FIG. 1A. In some such examples, the switches 308*a*, 308*b* can be operated (e.g., by the test controller 110) to selectively couple the boundary scan elements 104*a*, 104*b* to inputs of the differential I/O devices 306*c*, 306*d*. A boundary scan test signal can then be applied, by the test controller 110, to the differential I/O devices 306*c*, 306*d* using the boundary scan elements 104*a*, 104*b*, as described above with reference to FIG. 2A or 2B. The responses 304*e-h* of the differential I/O devices 306*c*, 306*d* to the boundary scan test signal may be observed at outputs of the differential I/O devices 306*c*, 306*d*. In some such examples, boundary scan testing of I/O devices with (e.g., first I/O devices 102*a*, 102*b*) and without (e.g., differential I/O devices 306*c*, 306*d*) boundary scan elements can be performed either in series, or in parallel, as in the examples of FIG. 2A or 2B.

In the examples shown in FIGS. 3A and 3B, the differential I/O devices 306*a* and 306*c* include the boundary scan element 104*c* for testing enable functionality. As shown, this boundary scan element 104*c* can be shared among multiple I/O devices, as described above with reference to FIGS. 2A and 2B. Because the differential I/O devices 306*a-d* employ differential signaling, the two individual I/O devices (e.g., I/O devices 302*a* and 302*b* for differential I/O device 306*a*) operate together. Accordingly, the enable functionality need only be tested for the respective pairs of I/O devices 302 (e.g., I/O devices 302*a* and 302*b* in combination), rather than for each I/O device 302*a-g* individually. Accordingly, as shown in FIG. 3A, for example, the differential I/O device 306*a* is coupled to one enable boundary scan element 104*c*, rather than two (e.g., boundary scan elements 104*c*, 104*d* in the example of FIG. 2A). A boundary scan to test the enable functionality may be performed in series with boundary scans testing the input/output functionality of the first I/O devices 102*a*, 102*b* and/or the differential I/O devices 306*a*, 306*b* (or 306*c*, 306*d*), or may be performed concurrently with boundary scans testing the input/output functionality of the first I/O devices 102*a*, 102*b* and/or the differential I/O devices 306*a*, 306*b* (or 306*c*, 306*d*).

Referring to FIG. 4, in some examples, boundary scan testing of the differential I/O devices 306*a*, 306*b* can be performed using internal latch cells (e.g., flip-flops, memory cells, buffer elements, gates, etc.) 402*a*, 402*b*. In the illustrated example, the circuit 100F includes the internal latch cells 402*a*, 402*b*, coupled to the outputs of the second I/O devices 106*a-d*, as shown. The latch cells 402*a*, 402*b* may be part of the test circuitry 108 of FIGS. 1A and 1B. In some examples, the latch cells 402*a*, 402*b* are re-used latch cells that are part of the circuitry 112 of FIG. 1B. As in the example of FIG. 3A, the differential I/O devices 306*a*, 306*b* are shown in FIG. 4 configured as input/receive channels; however, the techniques can also be applied to differential I/O devices 306*c*, 306*d* configured as output/transmit channels, as described above. In some examples, responses (e.g., signals 304*a-d*) from the differential I/O devices 306*a*, 306*b* to test signals applied at their inputs are stored on the internal latch cells 402*a*, 402*b*. The stored response signals can be observed by reading the latch cells, for example, using the test controller 110, an external device (e.g., the external test equipment 114 of FIGS. 1A and 1B), or internal circuitry (e.g., the internal circuitry 112 of FIG. 1B). In some examples, boundary scan testing of the differential I/O devices 306*a*, 306*b* in which the response signals are stored on the internal latch cells 402*a*, 402*b* can be formed in series with or concurrently with boundary scan testing of the first I/O devices 102*a*, 102*b*.

Turning to FIG. 5, there is illustrated an example of reading out test responses from the differential I/O devices 306*a*, 306*b* that have been captured by the internal latch cells 402*a*, 402*b*. In this example, switches 308*c*, 308*d* are used to selectively couple inputs of first I/O devices 102*c*, 102*d*, respectively, either to dedicated boundary scan elements 104*c*, 104*d*, or to the latch cells 402*a*, 402*b*, respectively. Thus, in some examples, during a first boundary scan sequence, the first I/O devices 102*a-d* can be tested using their boundary scan elements 104*a-d*, as described above. Similarly, as described above, the switches 308*a*, 308*b* can be operated (e.g., by the test controller 110) to selectively couple the outputs of the differential I/O device 306*b* to the boundary scan elements 104*a*, 104*b* to allow the response signals 304*c*, 304*d* to be read out via the boundary scan elements 104*a*, 104*b* and stored on the internal latch cells 402*a*, 402*b*, as described above. The switches 308*c*, 308*d* may then be operated (e.g., by the test controller 110; not shown in FIG. 5) to selectively couple the latch cells 402*a*, 402*b* to the first I/O devices 102*c*, 102*d*, respectively. The test results (e.g., the response signals 304*c*, 304*d*) stored in the latch cells 402*a*, 402*b*, can then be observed via outputs from the first I/O devices 102*c*, 102*d*, respectively, as shown. The switches 308*c*, 308*c*, can then be operated (e.g., by the test controller 110) to selectively re-couple the boundary scan elements 104*c*, 104*d*, to the first I/O devices 102*c*, 102*d*, respectively, to ready the circuit 100G for a next boundary scan test of the first I/O devices 102*c-d*.

Thus, the various circuit configurations illustrated and described with reference to FIGS. 2A-5, and variations thereof, can be used to achieve boundary scan-based DC parametric testing of I/O devices that do not have dedicated boundary scan elements. The techniques described herein may provide a solution for full DC parametric testing of all I/O devices in a circuit, without requiring physical access for probes and involving less testing time, resources, and/or complexity than some other testing methods. Furthermore, by sharing a single set of boundary elements among multiple sets of, optionally mixed format (e.g., CMOS and LVDS), I/O devices, the footprint of test circuitry on a circuit board or in an integrated circuit package can be advantageously reduced.

Methodology

As described above, examples provide techniques for applying boundary scan test routines for I/O devices that do not have dedicated boundary scan elements associated therewith.

Figure 6A:
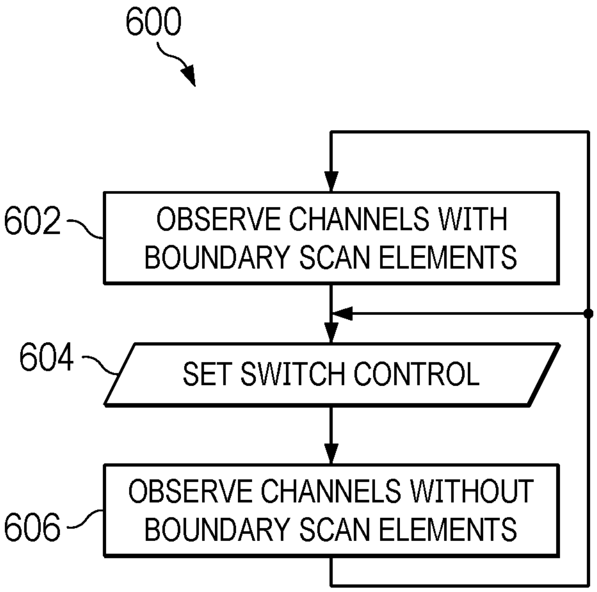
FIG. 6A is a flow diagram of a method of operating testing a circuit, according to an example.
Figure 6B:
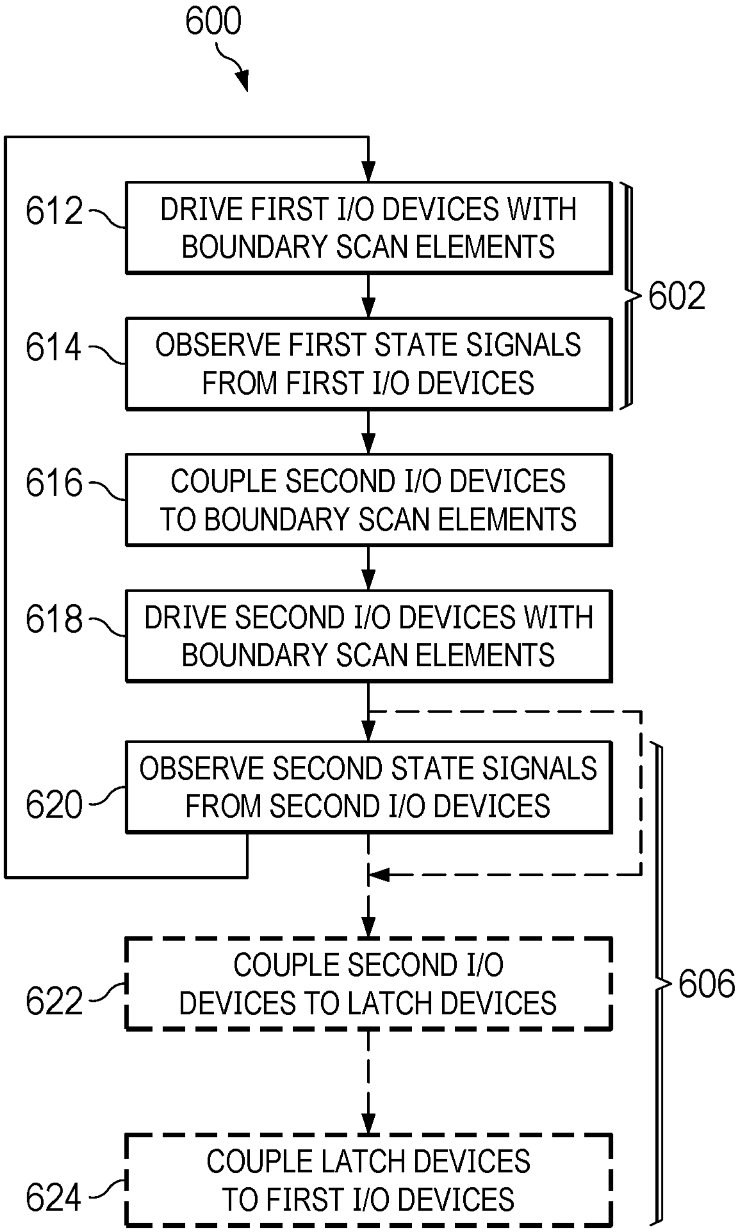
FIG. 6B is a flow diagram of an example of the method of FIG. 6A, according to certain aspects.

FIG. 6A is a flow diagram of one example of a testing methodology according to certain aspects of the disclosed technology. FIG. 6B is a flow diagram illustrating an example of the method 600. The method 600 can be applied to any circuit (e.g., circuit 100) that supports boundary scan testing for at least one I/O device. The method 600 may be implemented under the control of the test controller 110 and/or external test equipment 114, as illustrated and described above with reference to FIGS. 1A and 1B, for example.

Referring to FIG. 6A, according to certain examples, at operation 602, a first boundary scan sequence can be applied to test interconnections among at least I/O devices in circuits (e.g., I/O devices 102 of circuits 100A and 100B described above with reference to FIG. 1B) that have boundary scan elements 104 associated therewith (e.g., dedicated boundary scan elements). Thus, at operation 602, test responses of channels (e.g., I/O devices 102 and interconnects coupled thereto) with boundary scan elements 104 can be observed.

Referring to FIG. 6B, in some examples, operation 602 includes an operation 612 of driving first I/O devices with a test data stream via their dedicated (or shared) boundary scan elements. For example, as described above, the test controller 110 can load the test data stream to the boundary scan elements 104, which in turn drive the bits of the test data stream through output I/O devices 102/106 of the circuit 100A As described above, the test data stream may include a sequence of alternating binary values (e.g., 1s and 0s), with opposite binary values being applied at adjacent channels under test. At operation 614, state signals representing the test results from the test data stream applied at operation 612 to the circuit 100A can be observed at corresponding connected input I/O devices of the circuit 100B, as described above with reference to FIG. 1B.

Returning to FIG. 6A, after operation 602, at operation 604, a set of one or more switches can be controlled to allow for boundary scan testing of, and/or observation of test results from, channels that do not have boundary scan elements. At operation 606, the test results from boundary scan testing of the I/O devices without boundary scan elements can be observed using any of the approaches described above.

Referring again to FIG. 6B, at operation 616, the boundary scan elements are coupled to second I/O devices that do not have dedicated boundary scan elements associated therewith. In some examples, operation 616 can be performed concurrently with operation 602, with the boundary scan elements 104 being shared among I/O devices to which the boundary scan elements "belong" (e.g., first I/O devices 102) and I/O devices that do not have dedicated boundary scan elements (e.g., second I/O devices 106), as described above with reference to FIGS. 2A and 2B. In other examples, operation 616 includes operation 604 of activating switches (e.g., switches 306*a*, 306*b*) to couple the boundary scan elements to the second I/O devices and allow a single set of boundary scan elements to be used in multiple test sequences to test multiple sets of I/O devices. Thus, operation 604 may be performed as part of operation 616 or in addition to operation 616.

At operation 618, the second I/O devices 106 can be driven with a test signal (e.g., the test signal from the test controller 110) via the boundary scan elements 104, as described above.

At operation 620, second state signals representing the responses of the second I/O devices to the applied test signal can be observed.

In some examples, operation 606 involves using internal latch devices, as described above with reference to FIGS. 4 and 5. Accordingly, at operation 622, the second I/O devices can be coupled to the latch devices (e.g., latch devices 402), for example, using switches (e.g., switches 308) as described above. Thus, in some examples, operation 604 can include operation 622. In some examples, the test signal at operation 618 can be applied via external test equipment or boundary scan elements shared with one or more first I/O devices, as described above. In some such examples, operation 620 may include operation 622 of coupling the second I/O devices to the internal latch devices such that the test responses of the second I/O devices can be observed by reading out binary values stored on the latch devices, as described above. In some examples, operation 620 includes an operation 624 of coupling the internal latch devices to one or more first I/O devices. Thus, at operation, the test responses of the second I/O devices that were stored on the latch devices can be observed by observing the output signals from the first I/O devices to which the latch devices have been coupled.

Thus, aspects and examples provide techniques for applying boundary scan in circuits where at least some of the I/O devices do not have dedicated boundary scan elements. Boundary scan testing of these I/O devices can be performed in series or concurrently with boundary scan testing of other I/O devices that do have boundary scan elements. Accordingly, the time and resources needed to perform full DC parametric testing of a circuit can be reduced by leveraging existing boundary scan elements and avoiding the need for, possibly complex and time-consuming, separate testing of I/O devices without dedicated boundary scan elements.

FURTHER EXAMPLES

Example 1 is a circuit comprising: at least one first input/output (I/O) device, at least one boundary scan element coupled to the at least one first I/O device, at least one second I/O device coupled to the at least one boundary scan element, and a test controller coupled to the at least one boundary scan element and configured to control the at least one boundary scan element to drive the at least one first I/O device and the at least one second I/O device with a binary test signal.

Example 2 includes the circuit of Example 1, wherein the at least one first I/O device comprises a plurality of first I/O devices arranged adjacent to one another, wherein the at least one second I/O device comprises a plurality of second I/O devices, and wherein the binary test signal comprises a series of bits having alternating binary values such that adjacent first I/O devices and adjacent second I/O devices are driven with bits having opposite binary values.

Example 3 includes the circuit of Example 2, wherein the second plurality of I/O devices comprises an odd number of I/O devices. The circuit further comprises at least one inverter coupled to the at least one boundary scan element.

Example 4 includes the circuit of any one of Examples 1-3, wherein the at least one second I/O device comprises a plurality of second I/O devices. The circuit further comprises at least one switch that selectively couples the plurality of second I/O devices to the at least one boundary scan element.

Example 5 includes the circuit of any one of Examples 1-4, further comprising at least one latch device coupled to the at least one second I/O device.

Example 6 includes the circuit of Example 5, further comprising at least one switch that selectively couples the at least one latch device to the at least one first I/O device.

Example 7 includes the circuit of any one of Examples 1-6, wherein the at least one first I/O device is a CMOS I/O device, and wherein the at least one second I/O device is a low voltage differential signal I/O device.

Example 8 is a circuit comprising: a circuit board; a plurality of first input/output (I/O) devices disposed on the circuit board; a corresponding plurality of boundary scan elements disposed on the circuit board, individual boundary scan elements of the plurality of boundary scan elements coupled to respective individual first I/O devices of the plurality of first I/O devices; and a plurality of second I/O devices disposed on the circuit board and coupled to one or more of the plurality of boundary scan elements.

Example 9 includes the circuit of Example 8, further comprising a plurality of latch elements coupled to the plurality of second I/O devices, wherein the plurality of first I/O devices comprises a first subset of first I/O devices and a second subset of first I/O devices, and wherein the plurality of second I/O devices are coupled to the one or more boundary scan elements coupled to the first subset of first I/O devices.

Example 10 includes the circuit of Example 9, further comprising a plurality of switches that selectively couple the plurality of latch elements to the second subset of first I/O devices.

Example 11 includes the circuit of any one of Examples 8-10, further comprising a test controller coupled to the plurality of boundary scan elements and configured to control the plurality of boundary scan elements to drive the plurality of first I/O devices and the plurality of second I/O devices with a binary test signal.

Example 12 includes the circuit of Example 11, wherein the binary test signal comprises a series of bits having alternating binary values such that adjacent first I/O devices of the plurality of first I/O devices and adjacent second I/O devices of the plurality of second I/O devices are driven with bits having opposite binary values.

Example 13 includes the circuit of Example 12, wherein the plurality of boundary scan elements comprises a first subset of boundary scan elements and a second subset of boundary scan elements, wherein the plurality of second I/O devices comprises an odd number of second I/O devices, wherein the first subset of boundary scan elements and the second subset of boundary scan elements are respectively coupled to alternating adjacent ones of the second I/O devices, and wherein the second subset of boundary scan elements individually comprise an inverter to invert binary values of the binary test signal.

Example 14 includes the circuit of one of Examples 12 or 13, wherein the plurality of boundary scan elements comprises a plurality of shift register cells.

Example 15 is a method comprising: performing a first boundary scan test by (i) driving a plurality of first input/output (I/O) devices using a plurality of boundary scan elements, and (ii) observing first state signals from the plurality of first I/O devices; controlling a plurality of switches to couple the plurality of boundary scan elements to a plurality of second I/O devices; and performing a second boundary scan test by (i) driving the plurality of second I/O devices using the plurality of boundary scan elements, and (ii) observing second state signals from the plurality of second I/O devices.

Example 16 includes the method of Example 15, wherein observing the second state signals comprises reading a plurality of latch devices coupled to the plurality of second I/O devices.

Example 17 includes the method of Example 16, wherein observing the second state signals comprises controlling another plurality of switches to couple the plurality of latch devices to a subset of the plurality of first I/O devices, and observing the second state signals via the subset of the plurality of first I/O devices.

Example 18 includes the method of any one of Examples 15-17, wherein driving the plurality of first I/O devices comprises driving adjacent first I/O devices with opposite binary values.

Example 19 includes the method of Example 18, wherein driving the plurality of second I/O devices comprises driving adjacent second I/O devices with opposite binary values.

Example 20 includes the method of Example 19, wherein the plurality of second I/O devices comprises an odd number of second I/O devices, and wherein driving the plurality of plurality of second I/O devices comprises inverting, using at least one of the plurality of boundary scan elements, a binary test signal applied to a subset of the plurality of second I/O devices.

In this description, the term "couple" may cover connections, communications, or signal paths that enable a functional relationship consistent with this description. For example, if device A generates a signal to control device B to perform an action: (a) in a first example, device A is coupled to device B by direct connection; or (b) in a second example, device A is coupled to device B through intervening component C if intervening component C does not alter the functional relationship between device A and device B, such that device B is controlled by device A via the control signal generated by device A.

A device that is "configured to" perform a task or function may be configured (e.g., programmed and/or hardwired) at a time of manufacturing by a manufacturer to perform the function and/or may be configurable (or reconfigurable) by a user after manufacturing to perform the function and/or other additional or alternative functions. The configuring may be through firmware and/or software programming of the device, through a construction and/or layout of hardware components and interconnections of the device, or a combination thereof.

As used herein, the terms "terminal," "node," "interconnection," "pin," and "lead" are used interchangeably. Unless specifically stated to the contrary, these terms are generally used to mean an interconnection between or to a terminus of a device element, a circuit element, an integrated circuit, a device or other electronics or semiconductor component.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, such as by an end user and/or a third party.

In this description, unless otherwise stated, "about," "approximately" or "substantially" preceding a parameter means being within a range of that parameter, such as +/−10 percent of that parameter or +/−5 percent of that parameter.

Modifications are possible in the described examples, and other examples are possible within the scope of the claims.

What is claimed is:

1. A circuit comprising:

a plurality of first input/output (I/O) devices;

at least one boundary scan element coupled to the plurality of first I/O devices;

a plurality of second I/O devices;

an inverter coupled between the at least one boundary scan element and the plurality of second I/O devices; and test circuitry configured to selectively couple the plurality of second I/O devices to the at least one boundary scan element and configured to control the at least one boundary scan element to drive the plurality of first I/O devices and the plurality of second I/O devices with a binary test signal.

2. The circuit of claim 1, wherein:

the plurality of first I/O devices are arranged adjacent to one another;

the plurality of second I/O device are arranged adjacent to one another; and wherein the binary test signal comprises a series of bits having alternating binary values such that adjacent first I/O devices and adjacent second I/O devices are driven with bits having opposite binary values.

3. The circuit of claim 2, wherein the second plurality of I/O devices comprises an odd number of I/O devices.

4. The circuit of claim 1, further comprising:

at least one switch that selectively couples the plurality of second I/O devices to the at least one boundary scan element.

5. The circuit of claim 1, further comprising:

at least one latch device coupled to the plurality of second I/O devices.

6. The circuit of claim 5, further comprising:

at least one switch that selectively couples the at least one latch device to the plurality of first I/O devices.

7. The circuit of claim 1, wherein at least one of the plurality of first I/O devices is a complementary metal oxide semiconductor (CMOS) I/O device; and wherein t at least one of the plurality of second I/O devices is a low voltage differential signal I/O device.

8. A circuit comprising:

a circuit board;

a plurality of first input/output (I/O) devices disposed on the circuit board;

a plurality of boundary scan elements disposed on the circuit board and respectively coupled to the plurality of first I/O devices;

a plurality of switches disposed on the circuit board, a number of the plurality of switches being equal to a number of the plurality of first I/O devices; and a plurality of second I/O devices disposed on the circuit board, the number of the plurality of first I/O devices being unequal to a number of the plurality of second I/O devices;

wherein the plurality of boundary scan elements includes a first subset of boundary scan elements respectively dedicated to a first subset of the plurality of first I/O devices, and a second subset of boundary scan elements each shared between a respective one of the plurality of second I/O devices and a respective one of the second subset of the first plurality of first I/O devices.

9. The circuit of claim 8, further comprising a plurality of latch elements each coupled to a respective one of the plurality of second I/O devices, a respective one of the second subset of first I/O devices, and a respective one of the second subset of boundary scan elements.

10. The circuit of claim 8, further comprising:

a test controller coupled to the plurality of boundary scan elements and configured to control the plurality of boundary scan elements to drive the plurality of first I/O devices and the plurality of second I/O devices with a binary test signal.

11. The circuit of claim 10, wherein the binary test signal comprises a series of bits having alternating binary values such that adjacent first I/O devices of the plurality of first I/O devices and adjacent second I/O devices of the plurality of second I/O devices are driven with bits having opposite binary values.

12. The circuit of claim 11, wherein:

wherein the plurality of second I/O devices comprises an odd number of second I/O devices;

wherein the first subset of the boundary scan elements and the second subset of the boundary scan elements are respectively coupled to alternating adjacent ones of the second I/O devices; and wherein the second subset of the boundary scan elements individually comprise an inverter to invert binary values of the binary test signal.

13. The circuit of claim 11, wherein the plurality of boundary scan elements comprises a plurality of shift register cells.

14. A method comprising:

performing a first boundary scan test by (i) driving a plurality of first input/output (I/O) devices using a plurality of boundary scan elements, and (ii) observing first state signals from the plurality of first I/O devices;

controlling a plurality of switches to couple the plurality of boundary scan elements to a plurality of second I/O devices; and performing a second boundary scan test by (i) driving the plurality of second I/O devices using the plurality of boundary scan elements, and (ii) observing second state signals from the plurality of second I/O devices, wherein driving the plurality of second I/O devices comprises inverting, using at least one of the plurality of boundary scan elements, a binary test signal applied to a subset of the plurality of second I/O devices.

15. The method of claim 14, wherein observing the second state signals comprises reading a plurality of latch devices coupled to the plurality of second I/O devices.

16. The method of claim 15, wherein observing the second state signals comprises:

controlling another plurality of switches to couple the plurality of latch devices to a subset of the plurality of first I/O devices; and observing the second state signals via the subset of the plurality of first I/O devices.

17. The method of claim 14, wherein driving the plurality of first I/O devices comprises driving adjacent first I/O devices with opposite binary values.

18. The method of claim 17, wherein driving the plurality of second I/O devices comprises driving adjacent second I/O devices with opposite binary values.

19. The method of claim 18, wherein the plurality of second I/O devices comprises an odd number of second I/O devices.

* * * * *